(12) United States Patent
Mihara et al.

(10) Patent No.: US 8,663,424 B2
(45) Date of Patent: Mar. 4, 2014

(54) PLASMA PROCESSING APPARATUS AND GAS SUPPLY MEMBER SUPPORT DEVICE

(75) Inventors: Naoki Mihara, Miyagi (JP); Kenji Sudou, Miyagi (JP); Kazuo Murakami, Osaka (JP); Satoshi Furukawa, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 215 days.

(21) Appl. No.: 13/115,289

(22) Filed: May 25, 2011

(65) Prior Publication Data

US 2011/0308733 A1    Dec. 22, 2011

(30) Foreign Application Priority Data

May 26, 2010    (JP) ................................. 2010-120279

(51) Int. Cl.
  *C23C 16/00*    (2006.01)
  *C23F 1/00*    (2006.01)
  *H01L 21/306*    (2006.01)
(52) U.S. Cl.
  USPC .................. 156/345.33; 118/715; 156/345.34
(58) Field of Classification Search
  USPC ........... 156/345.33, 345.34, 345.41; 118/715, 118/723 MW
  See application file for complete search history.

(56) References Cited

U.S. PATENT DOCUMENTS

| | | | |
|---|---|---|---|
| 6,036,782 A * | 3/2000 | Tanaka et al. | 118/715 |
| 6,477,980 B1 * | 11/2002 | White et al. | 118/723 E |
| 2004/0035531 A1 * | 2/2004 | Donohoe et al. | 156/345.33 |
| 2009/0311872 A1 | 12/2009 | Ueda et al. | |
| 2011/0284100 A1 * | 11/2011 | Kudela et al. | 137/343 |

FOREIGN PATENT DOCUMENTS

| | | |
|---|---|---|
| JP | 2002-064102 | 2/2002 |
| JP | 2002-064104 | 2/2002 |
| JP | 2009-302324 | 12/2009 |
| JP | 2010-062318 | 3/2010 |
| KR | 10-2008-0048243 | 6/2008 |

* cited by examiner

*Primary Examiner* — Rakesh Dhingra
(74) *Attorney, Agent, or Firm* — Pearne & Gordon LLP

(57) ABSTRACT

There is provided a plasma processing apparatus capable of performing a plasma process while surely supplying a gas. The plasma processing apparatus includes an outer gas supply member having gas supply openings for supplying a plasma processing gas and a jacket configured to support the outer gas supply member within a processing chamber and serving as a gas supply member supporting device. The jacket includes three supporting members installed so as to connect the outer gas supply member and a sidewall and arranged at a certain distance in a direction in which the outer gas supply member extends and mounts fixed to the sidewall so as to mount the supporting members therein. The supporting members include a first supporting member fixed to a first mount and a second supporting member movably supported in a second mount.

7 Claims, 11 Drawing Sheets

US 8,663,424 B2

PLASMA PROCESSING APPARATUS AND GAS SUPPLY MEMBER SUPPORT DEVICE

CROSS-REFERENCE TO RELATED APPLICATION

This application claims the benefit of Japanese Patent Application No. 2010-120279 filed on May 26, 2010, the entire disclosures of which are incorporated herein by reference.

FIELD OF THE INVENTION

The present disclosure relates to a plasma processing apparatus and a gas supply member supporting device (hereinafter, simply referred to as a "supporting device"); and, more particularly, to a plasma processing apparatus for supplying a plasma processing gas when a plasma process is performed therein and a gas supply member supporting device for use in the plasma processing apparatus.

BACKGROUND OF THE INVENTION

A semiconductor device such as a LSI (Large Scale Integrated circuit) or a MOS (Metal Oxide Semiconductor) transistor is manufactured by performing various processes such as etching, CVD (Chemical Vapor Deposition), sputtering or the like on a semiconductor substrate (wafer) as a processing target substrate. A processing method using plasma as an energy source for etching, CVD or sputtering process includes plasma etching, plasma CVD, plasma sputtering or the like.

Here, a technology related to a plasma processing apparatus for performing the plasma process therein is described in Japanese Patent Laid-open Publication No. 2009-302324 (Patent Document 1).

Patent Document 1: Japanese Patent Laid-open Publication No. 2009-302324

Here, a general plasma processing apparatus described in the aforementioned Patent Document 1 includes a processing chamber having a cylindrical sidewall and configured to perform therein a plasma process on a processing target substrate; and a gas supply mechanism configured to supply a gas for the plasma process into the processing chamber. The gas supply mechanism supplies a gas for plasma excitation or a gas for plasma etching into the processing chamber.

A gas supply mechanism includes a gas supply member provided within the processing chamber and having a circular ring shape. By way of example, the gas supply member is provided above a holding table in order to supply the gas for the plasma process efficiently. Within the processing chamber, the gas supply member is fixed and supported by a multiple number of rod-shaped supporting members extending inwardly from an inner surface of the sidewall of the processing chamber in a diametric direction.

Here, a strong stress may be applied to the supporting members during the plasma process or at the time of installing the gas supply member. In such a case, since the supporting members are fixed to the sidewall and the gas supply member, the applied stress may be concentrated on the supporting members. As a result, replacement or maintenance of the supporting members may be frequently required, which is undesirable.

BRIEF SUMMARY OF THE INVENTION

In view of the foregoing, the present disclosure provides a plasma processing apparatus capable of performing a plasma process by surely supplying a gas while avoiding concentration of a stress on supporting members.

The present disclosure also provides a gas supply member support device capable of surely supporting a gas supply member in a processing chamber while avoiding concentration of a stress on supporting members.

In accordance with one aspect of the present disclosure, there is provided a plasma processing apparatus for performing a plasma process on a processing target substrate. The plasma processing apparatus includes a processing chamber including a bottom and a cylinder-shaped sidewall upwardly extending from a periphery of the bottom and configured to accommodate therein the processing target substrate; a gas supply member provided at a preset position within the processing chamber and provided with a gas supply opening for supplying a plasma processing gas; a multiple number of supporting members arranged at a certain distance so as to connect the gas supply member with the sidewall; and a mount capable of fixing each supporting member to the sidewall. Here, the supporting members may include a first supporting member fixed to the mount and a second supporting member movably supported in the mount.

In this configuration, since the second supporting member is movably supported in the mount, the gas supply member is allowed to move even in case that a stress is applied to the gas supply member during a plasma process or during installation of the gas supply member. Accordingly, concentration of a stress on the second supporting member can be avoided. In this configuration, since the first supporting member is fixed to the mount, the gas supply member can be stably supported at a certain position within the processing chamber. Accordingly, the plasma process can be performed while supplying the gas securely.

In accordance with another aspect of the present disclosure, there is provided a gas supply member supporting device installed in a plasma processing apparatus for performing a plasma process on a processing target substrate. The plasma processing apparatus includes a processing chamber having a bottom and a cylinder-shaped sidewall upwardly extending from a periphery of the bottom and configured to accommodate therein the processing target substrate; and a gas supply member provided at a preset position within the processing chamber and provided with a gas supply opening for supplying a plasma processing gas. The gas supply member supporting device is configured to support the gas supply member within the processing chamber and includes a multiple number of supporting members arranged at a certain distance so as to connect the gas supply member with the sidewall; and a mount capable of fixing each supporting member to the sidewall. Here, the supporting members may include a first supporting member fixed to the mount and a second supporting member movably supported in the mount.

By using this gas supply member support device, the gas supply member provided within the processing chamber can be surely supported.

In accordance with the plasma processing apparatus and the gas supply member support device described above, since the second supporting member is movably supported in the mount, the gas supply member is allowed to move even in case that a stress is applied to the gas supply member during a plasma process or during installation of the gas supply member. Accordingly, concentration of a stress on the second supporting member can be avoided. In this configuration, since the first supporting member is fixed to the mount, the gas supply member can be stably supported at a certain position within the processing chamber. Accordingly, the plasma process can be performed while supplying the gas securely.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
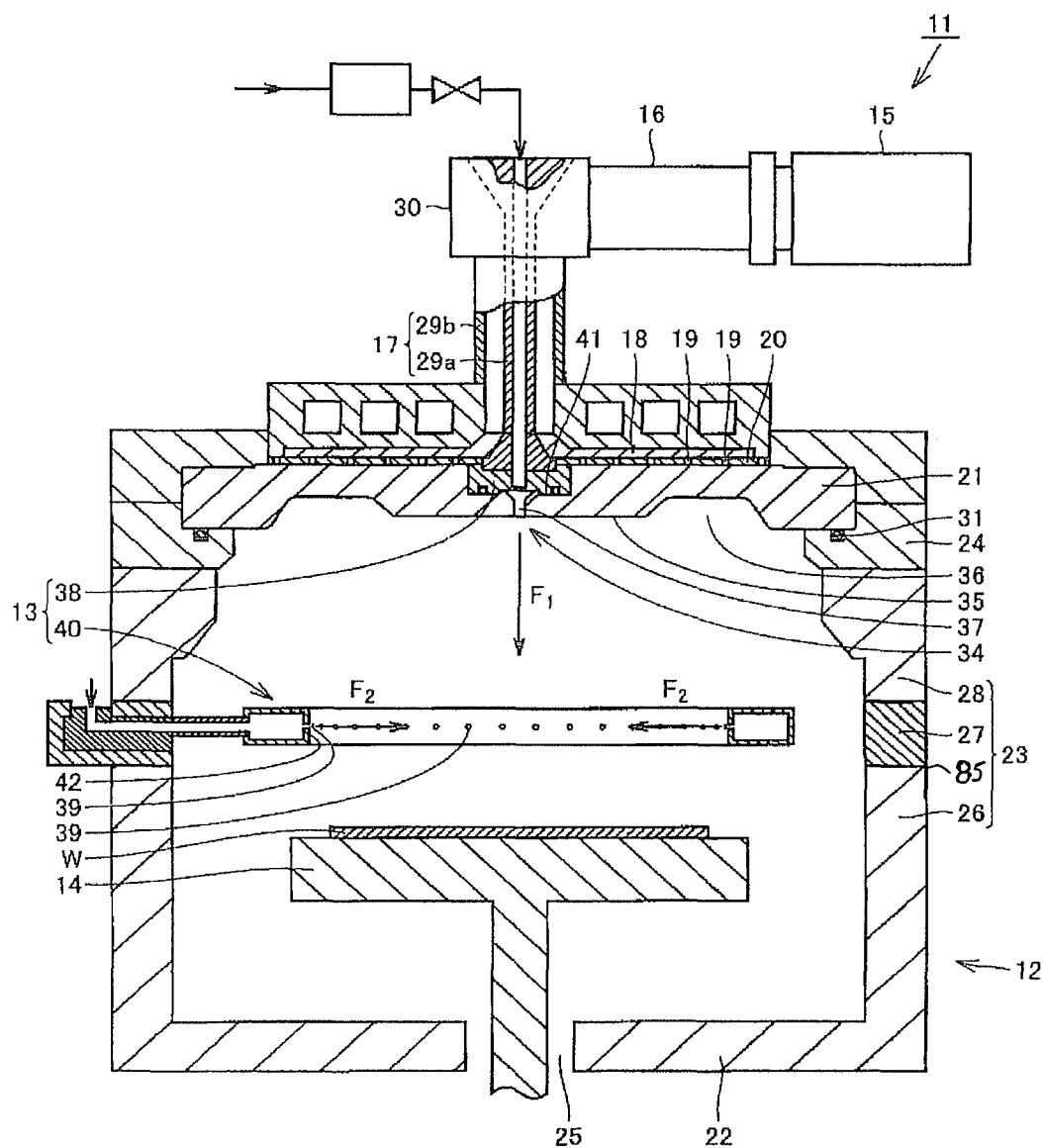
FIG. 1 is a cross sectional view illustrating a schematic configuration of a plasma processing apparatus in accordance with an embodiment of the present disclosure.
Figure 2:
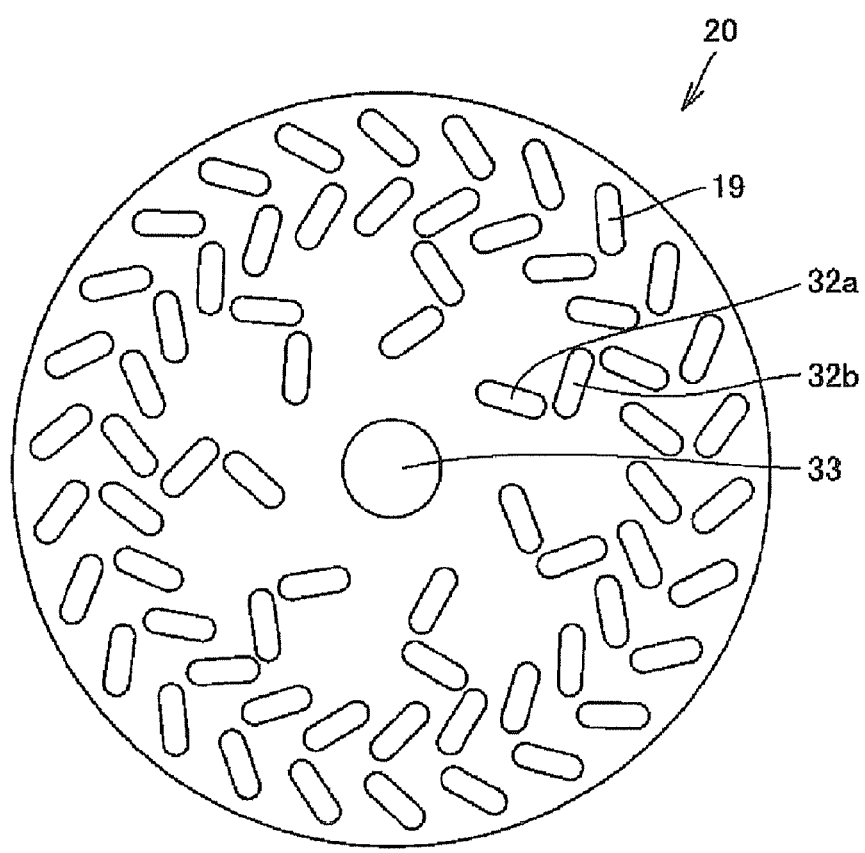
FIG. 2 is a diagram illustrating a slot antenna plate of the plasma processing apparatus in accordance with the embodiment of the present disclosure, when viewed from a plate thickness direction.
Figure 3:
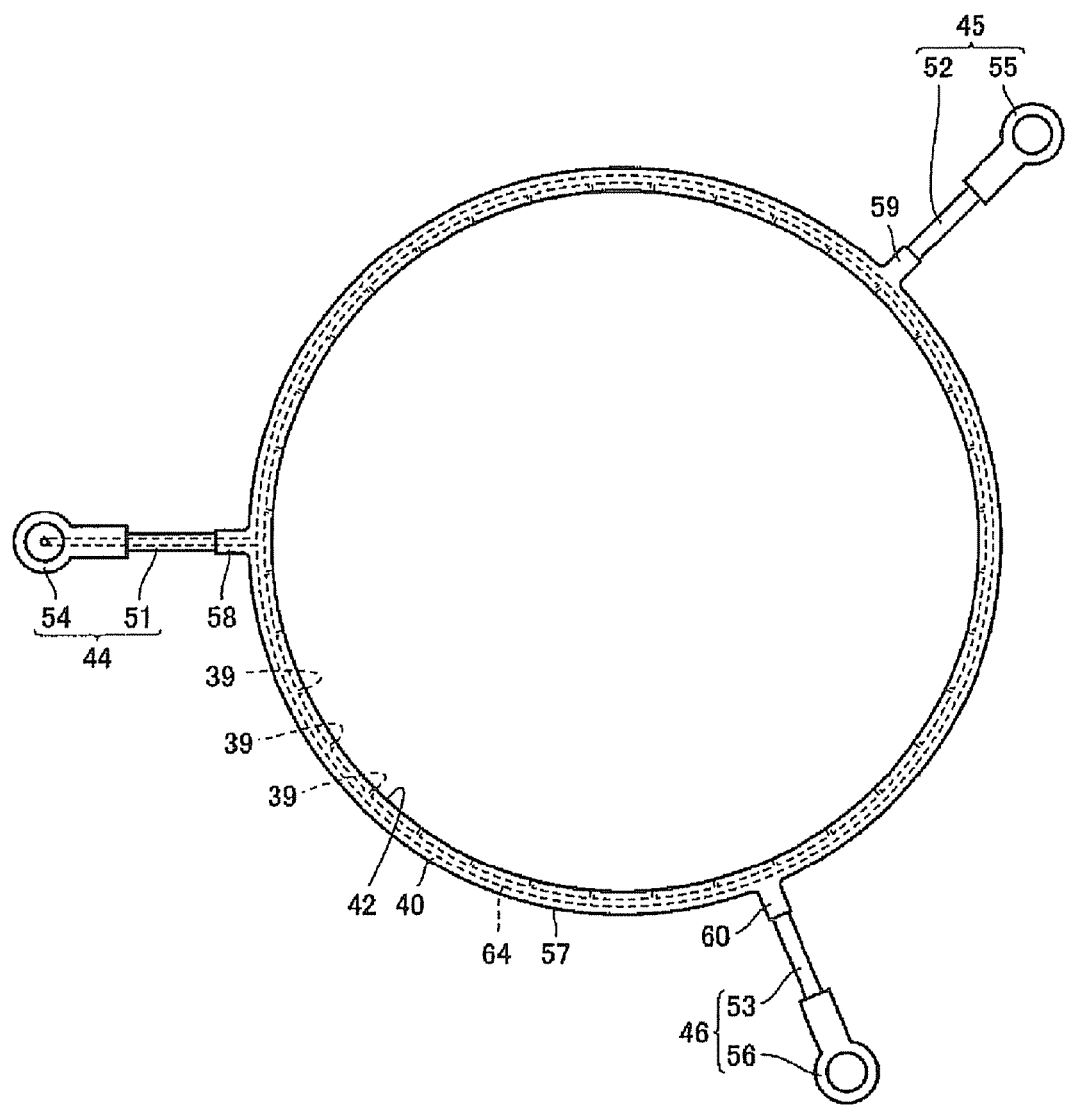
FIG. 3 is a diagram illustrating an outer gas supply member included in a gas supply mechanism of the plasma processing apparatus shown in FIG. 1, when viewed from the top.

Hereinafter, embodiments of the present disclosure will be described with reference to the accompanying drawings. First, a configuration of a plasma processing apparatus in accordance with an embodiment of the present disclosure will be explained. FIG. 1 is a cross sectional view illustrating a schematic configuration of a plasma processing apparatus in accordance with an embodiment of the present disclosure. FIG. 2 is a diagram illustrating a slot antenna plate of the plasma processing apparatus shown in FIG. 1, when viewed from a plate thickness direction. FIG. 3 is a diagram illustrating an outer gas supply member included in a gas supply mechanism of the plasma processing apparatus shown in FIG. 1, when viewed from the top of the plasma processing apparatus.

Referring to FIGS. 1 to 3, a plasma processing apparatus 11 in accordance with an embodiment of the present disclosure is configured as a microwave plasma processing apparatus using a microwave as a plasma source. The plasma processing apparatus 11 may include a processing chamber 12 having a processing space in which a plasma process is performed on a processing target substrate W; a gas supply mechanism 13 capable of supplying a plasma processing gas or the like into the processing chamber 12; a holding table 14 installed within the processing chamber 12 and configured to hold the target substrate W thereon; a microwave generator 15 installed outside the processing chamber 12 and capable of generating a microwave for plasma excitation; a waveguide 16 and a coaxial waveguide 17 configured to introduce the microwave generated by the microwave generator 15 into the processing chamber 12; a dielectric plate 18 connected to a lower end of the coaxial waveguide 17 and configured to propagate the microwave introduced by the coaxial waveguide in a diametric direction; a slot antenna plate 20 provided under the dielectric plate 18 and having a multiple number of slot holes 19 through which the microwave propagated by the dielectric plate 18 is radiated; a dielectric window 21 provided under the slot antenna plate 20 and configured to propagate the microwave radiated from the slot holes 19 in the diametric direction and transmit the microwave into the processing chamber 12; and a control unit (not shown) capable of controlling the entire plasma processing apparatus 11. The control unit controls processing conditions for performing the plasma process on the processing target substrate W such as a gas flow rate of the gas supply mechanism 13 or an internal pressure of the processing chamber 12. Further, for the simplicity of illustration, opening shapes of the slot holes 18 are schematically shown in FIG. 1.

The processing chamber 12 is configured to accommodate therein the processing target substrate W. The processing chamber 12 may include a bottom 22 positioned under the holding table 14; a sidewall 23 extending upward from the periphery of the bottom 22; and a circular ring-shaped member 24 mounted on the top of the sidewall 23 and capable of mounting the dielectric window 21 thereon. The sidewall 23 is made of a metal such as aluminum and has a cylindrical shape. A gas exhaust hole 25 for gas exhaust is provided in a central area of the bottom 22 of the processing chamber 12 in a diametric direction. The top of the processing chamber 12 is opened, and the processing chamber 12 can be hermetically sealed by the dielectric window 21 provided at the top of the processing chamber 12 and an O-ring 31 as a sealing member provided between the dielectric window 21 and the processing chamber 12, specifically, between the dielectric window 21 and the circular ring-shaped member 24 of the processing chamber 12.

Here, the sidewall 23 may include a cylindrical lower wall 26 extending upward from the periphery of the bottom 22; a cylindrical jacket 27 mounted on the top of the lower wall 26; and a cylindrical upper wall 28 mounted on the top of the jacket 27. That is, the sidewall 23 may be formed by stacking the lower wall 26, the jacket 27 and the upper wall 28 in sequence from the bottom 22.

Here, the lower wall 26 and the jacket 27 are separable. That is, the sidewall 23 can be separated in a vertical direction by the jacket 27 as a boundary 85. With this configuration, the processing chamber 12 can be divided into an upper area and a lower area and an inner surface of the sidewall 23 can be cleaned easily. Accordingly, maintainablility can be improved. Alternatively, the jacket 27 and the upper wall 28 may be configured to be separable from each other.

The holding table 14 mounts and holds thereon the processing target substrate W of a circular plate shape. The holding table 14 is electrically connected with a high frequency RF (Radio Frequency) bias power supply via a matching unit and a power supply rod (all are not shown).

The microwave generator 15 is connected to an upstream side of the waveguide 16 for introducing a microwave via a mode converter 30 and the coaxial waveguide 17 including a central conductor 29a and an outer conductor 29b. Both of the central conductor 29a and the outer conductor 29b of the coaxial waveguide 17 have cylindrical shapes and are concentrically arranged and are extended in a vertical direction of FIG. 1 while an outer surface of the central conductor 29a is spaced apart from an inner surface of the outer conductor 29b.

The slot antenna plate 20 is of a thin circular plate shape. Both opposite surfaces of the slot antenna plate 20 in a plate thickness direction are plane. The slot antenna plate 20 is provided with the multiple slot holes 19 formed through the slot antenna plate 20 in the plate thickness direction. The slot holes 19 may include first slot holes 32a elongated in one directions and second slot holes 32b elongated in directions orthogonal to the first slot holes 32a such that every two adjacent slot holes 32a and 32b makes a pair. To elaborate, every pair of two adjacent slot holes 32a and 32b are arranged so as to be inclined against each other in opposite directions. Seven (7) pairs of slot holes 32a and 32b provided in the inner area of the slot antenna plate 20 and twenty eight (28) pairs of slot holes 19 provided in the outer area of the slot antenna plate 20 are arranged at regular intervals along a circumferential direction, respectively. A through hole 33 is also provided in a center of the slot antenna plate 20 in a diametric direction. The slot antenna plate 20 has rotational symmetry with respect to the center thereof in the diametric direction.

The dielectric window 21 has a substantially circular plate shape and a certain thickness. The dielectric plate 21 is made of a dielectric material. By way of example, the dielectric window 21 is made of quartz or alumina. In the plasma processing apparatus 11, the bottom of dielectric window 21 is mounted on the circular ring-shaped member 24 of the processing chamber 12. A through hole 34 is formed at a center of the dielectric window 21 to pass through the dielectric window 21 in a thickness direction, i.e., in a vertical direction of FIG. 1. A diameter of an upper portion of the through hole 34 is larger than that of a lower portion of the through hole 34. Further, a dielectric window recess 36 is formed inwardly in a taper shape in a thickness direction, i.e., in an upward direction of FIG. 1. Further, the dielectric window recess 36 is formed in a ring shape on the bottom surface 35 under which plasma is generated. Furthermore, the dielectric window recess 36 is positioned on an outer area of the bottom surface 35 in a diametric direction.

A plasma processing gas is supplied into the processing chamber 12 by the gas supply mechanism 13. In the plasma processing apparatus 11, a temperature of the processing chamber 12 is set to be an appropriate temperature for a process within a range of, e.g., about 30° C. to about 80° C. The microwave generated by the microwave generator 15 is propagated to the dielectric plate 18 through the coaxial waveguide 17 and is radiated to the dielectric window 21 from the slot holes 19 provided in the slot antenna plate 20. The microwave that has penetrated the dielectric window 21 generates an electric field directly under the dielectric window 21, and, thus, plasma is generated within the processing chamber 12. The plasma generated directly under the dielectric window 21 is diffused away from the dielectric window 21 toward the holding table 14. In a plasma diffusion area including the processing target substrate W mounted on the holding table 14, a plasma process such as a plasma etching process is performed on the processing target substrate W by the diffused plasma. The plasma processing apparatus using the slot antenna plate 20 is called as a RLSA (Radial Line Slot Antenna) microwave plasma processing apparatus.

Now, a configuration of the gas supply mechanism 13 for supplying the plasma processing gas into the processing chamber 12 will be explained. The gas supply mechanism 13 may include an injector 38 as a center gas supply member having a gas supply opening 37 for supplying a gas toward a center of the processing target substrate W and an outer gas supply member 40 having gas supply openings 39 for discharging the gas to the inside in a diametric direction.

The center gas supply member uses a hollow portion of the central conductor 29a of the coaxial waveguide 17 as a gas supply path. The injector 38 is provided inside of the dielectric window 21. To elaborate, the small-diameter lower portion of the through hole 34 formed in the dielectric window 21 serves as the gas supply opening 37 of the injector 38, while the large-diameter upper portion serves as a receiving recess 41 for allowing the injector 38 to be mounted therein.

Then, a configuration of the outer gas supply member 40 will be elaborated. Since the outer gas supply member 40 is provided within the processing chamber 12 in which the plasma is generated, the outer gas supply member 40 is made of a dielectric material. By way of example, the outer gas supply member 40 may be made of quartz.

In the processing chamber 12, the outer gas supply member 40 is provided between the dielectric window 21 and the holding table 14 and is positioned at an area deviated from a vertically upper region of the processing target substrate W. The outer gas supply member 40 has a ring shape and the inside of the outer gas supply member 40 is hollow. An inner diameter of the outer gas supply member 40 is slightly larger than an outer diameter of the processing target substrate W. A hollow inside of the outer gas supply member 40 has a substantially rectangular cross sectional shape. Each of the gas supply openings 39 of the outer gas supply member 40 is formed by opening an inner wall surface of the outer gas supply member 40 in a circular shape. The gas supply holes 39 are substantially equi-spaced at a certain distance.

The injector 38 and the outer gas supply member 40 supply the plasma processing gas or the like into the processing chamber 12 from the outside of the processing chamber 12. Flow directions of gases supplied from the gas supply openings 37 and 39 are indicated by arrows $F_1$ and $F_2$ in FIG. 1, respectively. Further, flow rates or kinds of the gases supplied from the injector 38 and the outer gas supply member 40 can be selected as necessary. By way of example, different kinds of gases may be supplied from the injector 38 and the outer gas supply member 40, respectively, or only the outer gas supply member 40 may supply a gas into the processing chamber 12 while no gas is supplied from the injector 38. Moreover, flow directions of the gases may also be selected depending on a process involved.

Figure 4:
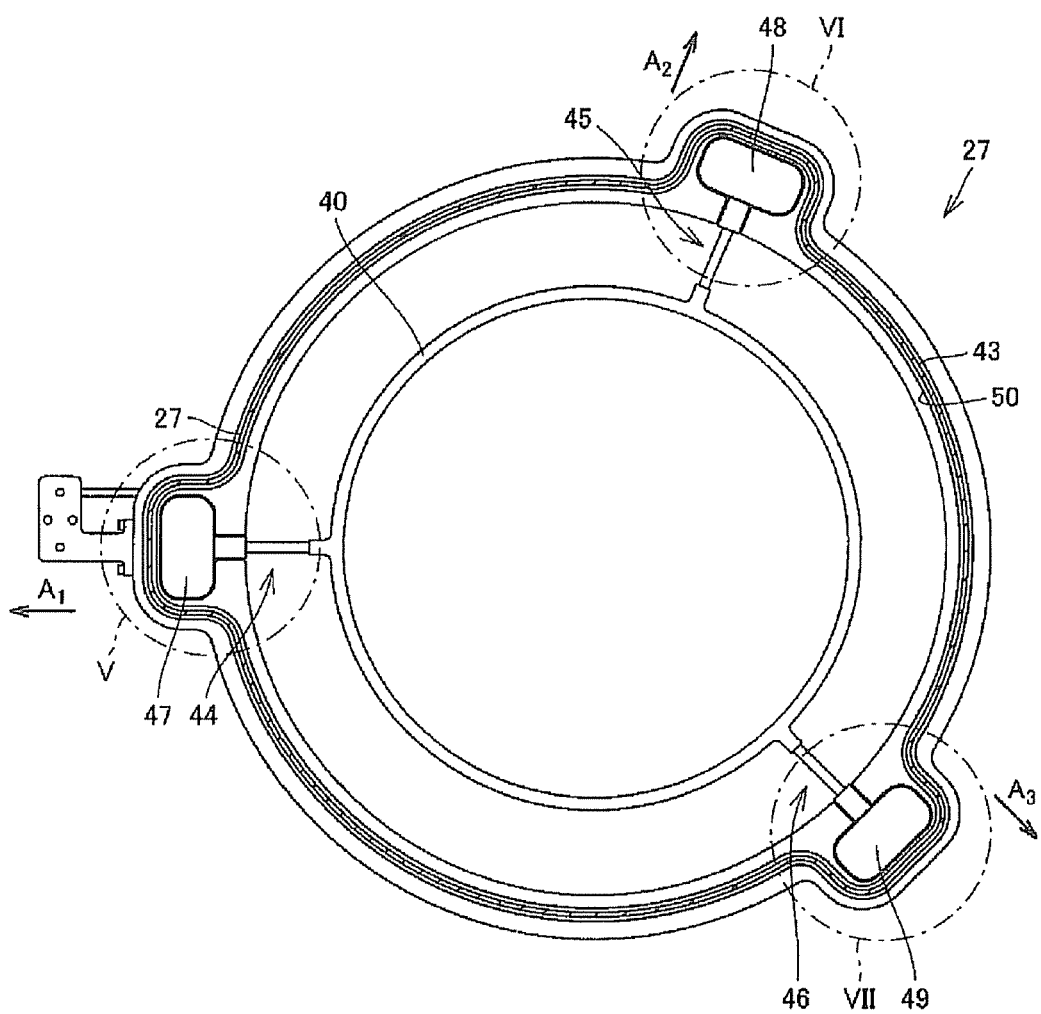
FIG. 4 is a diagram illustrating a jacket unit including the outer gas supply member shown in FIG. 3.
Figure 5:
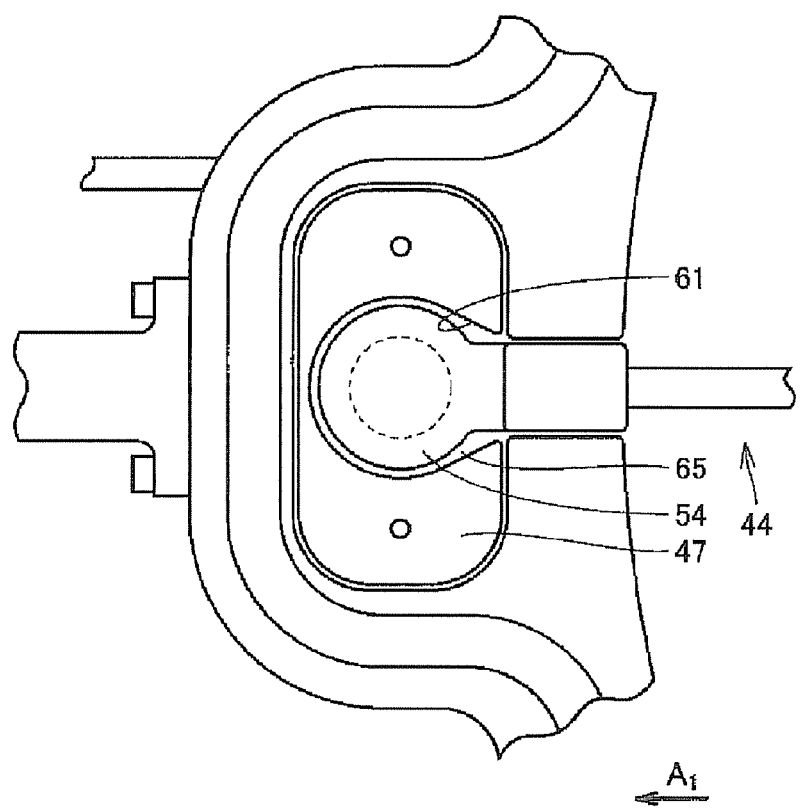
FIG. 5 is an enlarged view illustrating a connection part between a first mount and a first supporting member.
Figure 6:
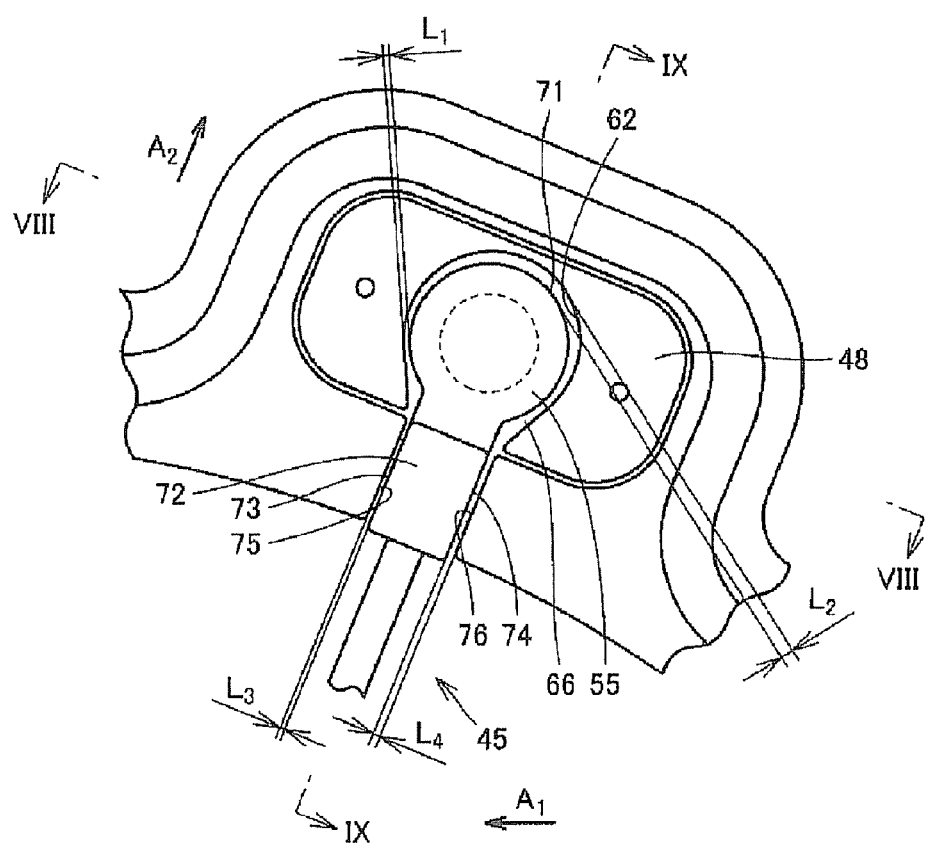
FIG. 6 is an enlarged view illustrating a connection part between a second mount and a second supporting member.
Figure 7:
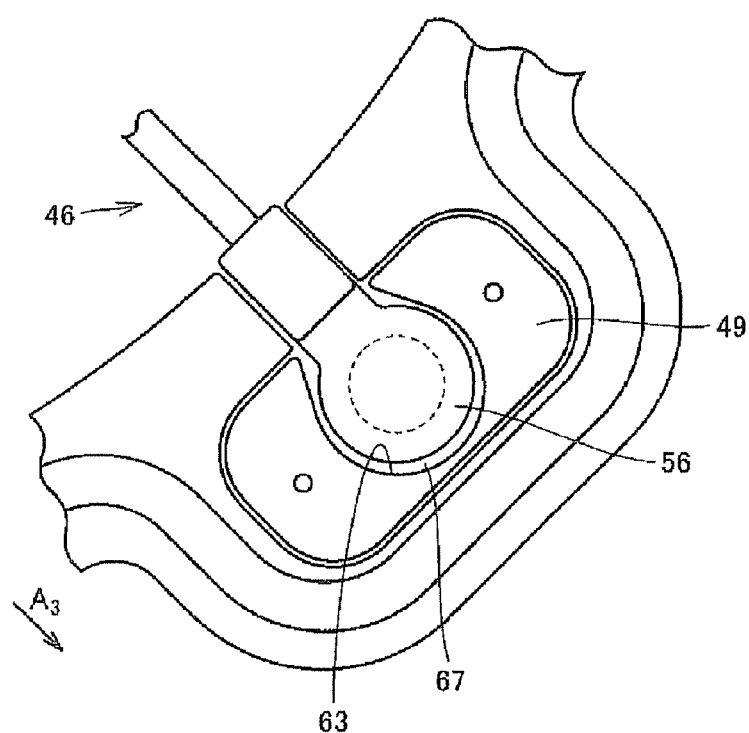
FIG. 7 is an enlarged view illustrating a connection part between the second mount and the second supporting member.
Figure 8:
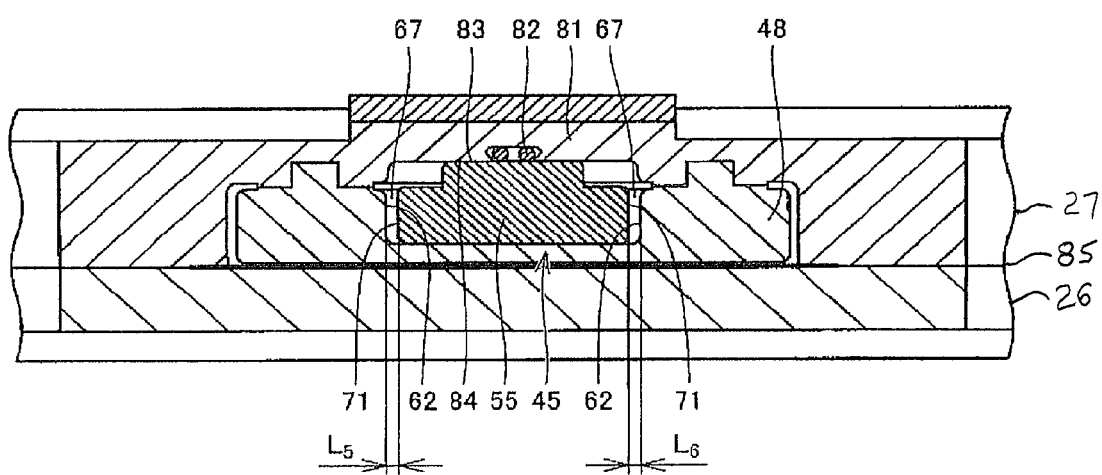
FIG. 8 is an enlarged cross sectional view illustrating the connection part between the second mount and the second supporting member before thermal expansion, when taken along a direction perpendicular to a diametric direction.
Figure 9:
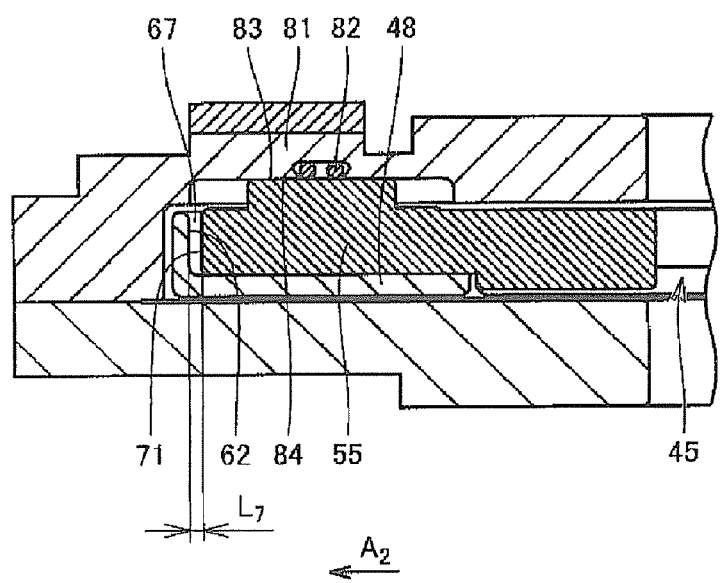
FIG. 9 is an enlarged cross sectional view illustrating the connection part between the second mount and the second supporting member before thermal expansion, when taken along a diametric direction.

In the processing chamber 12, the outer gas supply member 40 is supported by an outer gas supply member supporting device. FIG. 4 is a schematic diagram illustrating the jacket 27 serving as the outer gas supply member supporting device, when viewed from the top, after the jacket 27 and the upper wall 28 of the plasma processing apparatus 11 are separated from each other. FIG. 5 is an enlarged view of a part V of FIG. 4 and illustrates a connection state between a first mount and a first supporting member to be described later. FIG. 6 is an enlarged view of a part VI of FIG. 4 and illustrates a connection state between a second mount and a second supporting member to be described later. FIG. 7 is an enlarged view of a part VII of FIG. 4 and illustrates a connection state between the second mount and the second supporting member to be described later. FIG. 8 is an enlarged cross sectional view taken along a line VIII-VIII of FIG. 6 and illustrates a connection part between the second mount and the second supporting device taken along a direction perpendicular to a diametric direction. FIG. 9 is an enlarged cross sectional view taken along a line IX-IX of FIG. 6 and illustrates the connection part between the second mount and the second supporting member taken along the diametric direction. FIGS. 8 and 9 show states before thermal expansion.

Referring to FIGS. 1 to 9, the jacket 27 as the supporting device may include a cylindrical member 43 provided between the lower wall 26 and the upper wall 28; three supporting members 44, 45 and 46 installed so as to connect the outer gas supply member 40 and the sidewall 23 and arranged at a certain distance in a circumferential direction in which the outer gas supply member 40 extends; and three mounts 47, 48 and 49 fixed to the sidewall 23 so as to mount the three supporting members 44 to 46 therein. The three mounts 47 to 49 are fixed to the cylindrical member 43 and are arranged so as to be equi-spaced along the circumferential direction. Each of the mounts 47 to 49 is formed by recessing a part of an inner wall surface of the cylindrical member 43 outwardly in a diametric direction. Here, the mounts 47 to 49 are fixed at positions rotated by about 120° with respect to a diametric center of the cylindrical member 43.

The supporting member 44 may include a rod-shaped member 51 extending straightly in a diametric direction; and an arc-shaped member 54 installed at an outer end of the rod-shaped member 51. To be specific, an end portion of the arc-shaped member 54 is of an arc shape, when viewed from the top. Likewise, the supporting member 45 may include a rod-shaped member 52 and an arc-shaped member 55, and the supporting member 46 may include a rod-shaped member 53 and an arc-shaped member 56. The rod-shaped members 52 and 53 may have the same shape as that of the rod-shaped member 51, and the arc-shaped members 55 and 56 may have the same shape as that of the arc-shaped member 54. Three protrusions 58, 59 and 60 are extended outward from an outer wall surface 57 of the outer gas supply member 40 to be connected with the three supporting members 44 to 46. The three protrusions 58 to 60 are connected with the three supporting members 44 to 46, respectively. Meanwhile, a recess 61 is formed at the mount 47 so as to accommodate the arc-shaped member 54 therein, and when viewed from the top, the recess 61 is formed in a curved surface shape. Likewise, the mounts 48 and 49 are also provided with recesses 62 and 63, respectively. The arc-shaped members 54 to 56 are fitted into the three recesses 61 to 63, so that the mounts 47 to are connected with the supporting members 44 to 46, respectively. The first supporting member 44 is held in the first mount 47, and the second supporting members 45 and 46 are held in the second mounts 48 and 49. With this configuration, the outer gas supply member 40 and the sidewall 23, specifically, the outer gas supply member 40 and the jacket 27 serving as a part of the sidewall 23 are connected with each other.

Among the supporting members 44 to 46, the first supporting member 44 has a hollow area therein. Further, the protrusion 58 also has a hollow area therein and its hollow area communicates with the hollow area of the outer gas supply member 40. A gas may be supplied into the outer gas supply member 40, specifically, into a gas flow path 64 formed by the hollow area of the outer gas supply member 40 via the hollow area of the first supporting member 44 from the outside of the processing chamber 12. Meanwhile, among the supporting members 44 to 46, the insides of the two second supporting members 45 and 46 are solid. That is, no cavity is formed within the supporting members 45 and 46.

Here, the supporting members 44 to 46 include the first supporting member 44 firmly fixed to the first mount and the second supporting members 45 and 46 movably supported in the second mounts 48 and 49. Specifically, the supporting members 44 to 46 are configured as follows.

The first supporting member 44 is firmly fixed to the first mount 47. To elaborate, the arc-shaped member 54 and the first mount 47 are fixed to each other, and a size of a gap 65 between the arc-shaped member 54 and the recess 61 is constant without being varied in all directions. That is, the first supporting member 44 fixed to the first mount 47 does not move in all directions including a direction indicated by an arrow $A_1$ in FIG. 5 in which the first supporting member 44 extends. Here, it may be also possible to provide an O-ring (not shown) between the first supporting member 44 and the first mount 47. In such a case, the O-ring can be disposed within the gap 65. Desirably, the O-ring may have low sliding characteristics and a high sealing property.

Meanwhile, the second supporting member 45 is supported in the second supporting member 48 so as to be freely movable therein. To be specific, a size of a gap 66 between the arc-shaped member 55 and the recess 62 is variable in all directions within a tolerance range.

To elaborate, the second supporting member 45 is supported in the second mount 48 so as to be movable by a distance as large as the gap 66 in all directions including the direction indicated by the arrow $A_1$ of FIG. 6 or in a direction indicated by an arrow $A_2$ in which the second supporting member 45 extends. That is, the second supporting member 45 is movable within a range defined by a gap $L_1$ or $L_2$ between an outer surface 71 of the arc-shaped member 55 and the recess 62 or a range defined by a gap $L_3$ or $L_4$ between peripheral ends 73 and 74 of a base 72 of the arc-shaped member 55 and peripheral ends 75 and 76 of the second mount 48's recess 62 in which the base 72 is accommodated.

Like the second supporting member 45, the second supporting member 46 is supported in the second mount 49 so as to be freely movable therein. To be specific, a size of a gap 67 between the arc-shaped member 56 and the recess 63 is variable in all directions within a tolerance range. That is, the second supporting member 46 is supported in the second mount 49 so as to be movable by a distance as large as the gap 67 in all directions including the direction indicated by the arrow $A_1$ of FIG. 6 or in a direction indicated by an arrow $A_3$ in which the second supporting member 46 extends.

Here, when a plasma process is performed by the plasma processing apparatus including the gas supply member, a processing temperature may be varied depending on the kind of the plasma process or the like. In such a case, the following problems may be caused. The sidewall of the processing chamber may be made of a metal such as aluminum, whereas the ring-shaped gas supply member provided within the processing chamber is made of quartz. If the processing temperature in the plasma processing apparatus is varied, the supporting member that supports the gas supply member may receive a great stress in a diametric direction due to a difference in thermal expansion coefficients between the sidewall of the processing chamber and the gas supply member. To elaborate, by way of example, if the processing temperature increases, the cylindrical sidewall made of aluminum tends to expand in the diametric direction larger than the ring-shaped gas supply member made of quartz. In such a case, an outwardly oriented strong stress generated by the expansion may be applied to the supporting member. Since, however, the supporting member is fixed to the sidewall and the gas supply member, the supporting member may fail to vary according to a deformation by heat, which is deemed to be undesirable because replacement or maintenance of the supporting member may be frequently required.

Here, in accordance with the plasma processing apparatus 11 having the above-described configuration, the second supporting members 45 and 46 are supported in the second mounts 48 and 48 so as to be freely movable therein. Accordingly, even in case that a temperature variation occurs in the plasma processing apparatus 11, a movement of the outer gas supply member 40 may be allowed according to a deformation of the outer gas supply member 40 due to the temperature variation. Therefore, concentration of a stress on the second supporting members 45 and 46 can be avoided even if the outer gas supply member 40 and the sidewall 23 having different thermal expansion coefficients are deformed according to a temperature variation, respectively. In such a case, since the first supporting member 44 is fixed to the first mount 47, the outer gas supply member 40 can be stably supported at a preset position within the processing chamber 12. Accordingly, the plasma process can be performed while supplying the gas securely.

That is, in accordance with the above-described plasma processing apparatus, since the second supporting member is movably supported in the mount, the gas supply member is allowed to move even in case that a stress is applied to the gas supply member during a plasma process or during installation of the gas supply member. Accordingly, concentration of a stress on the second supporting member can be avoided. In this embodiment, since the first supporting member is fixed to the mount, the gas supply member can be stably supported at a certain position within the processing chamber. Accordingly, the plasma process can be performed while supplying the gas securely.

Furthermore, in accordance with the embodiment of the present disclosure, a gas supply member supporting device is installed in a plasma processing apparatus for performing a plasma process on a processing target substrate. The plasma processing apparatus includes a processing chamber having a bottom and a cylinder-shaped sidewall upwardly extending from a periphery of the bottom and configured to accommodate therein the processing target substrate; and a gas supply member provided at a preset position within the processing chamber and provided with a gas supply opening for supplying a plasma processing gas. The gas supply member supporting device is configured to support the gas supply member within the processing chamber and includes a multiple number of supporting members arranged at a certain distance so as to connect the gas supply member with the sidewall; and a mount capable of fixing each supporting member to the sidewall. Here, the supporting members may include a first supporting member fixed to the mount and a second supporting member movably supported in the mount.

By using this gas supply member supporting device, the gas supply member provided within the processing chamber can be securely supported.

Figure 10:
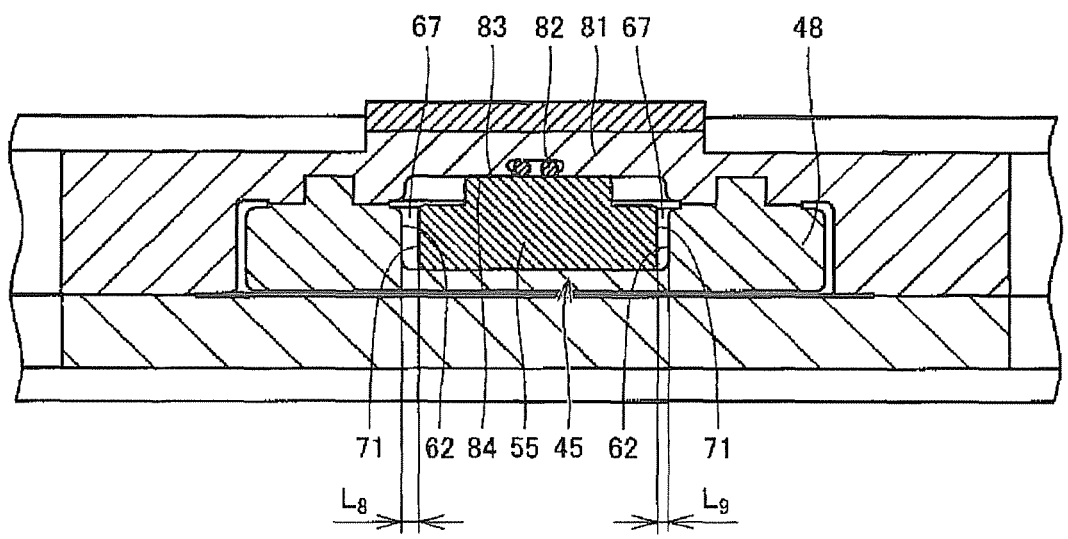
FIG. 10 is an enlarged cross sectional view illustrating the connection part between the second mount and the second supporting member after thermal expansion, when taken along a direction perpendicular to a diametric direction.
Figure 11:
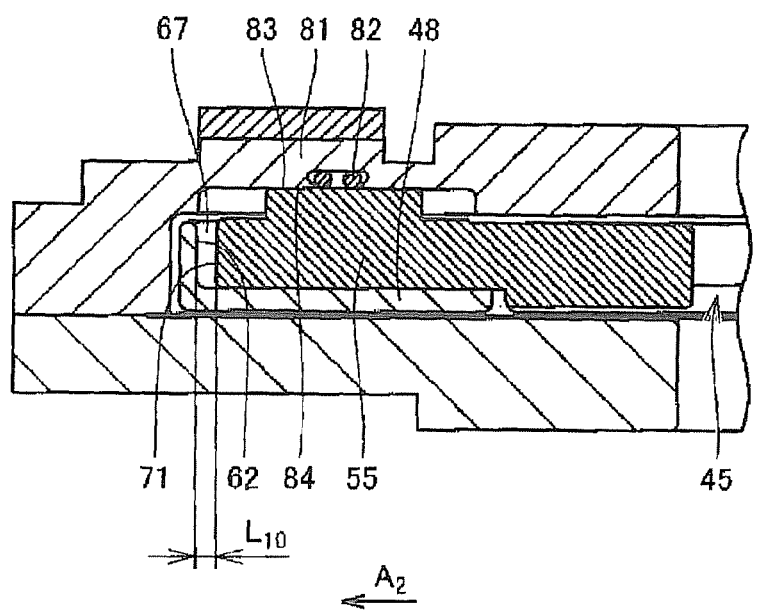
FIG. 11 is an enlarged cross sectional view illustrating the connection part between the second mount and the second supporting member after thermal expansion, when taken along a diametric direction.

More detailed description will be provided as follows. FIG. 10 is an enlarged cross sectional view illustrating a connection part between the second mount and the second supporting member after thermal expansion, when taken along a direction perpendicular to the diametric direction. FIG. 11 is an enlarged cross sectional view illustrating the connection part between the second mount and the second supporting member after thermal expansion, when taken along the diametric direction. Further, FIG. 10 corresponds to FIG. 8, and FIG. 11 corresponds to FIG. 9. In FIGS. 8 and 10, the left side of the drawing is in a direction indicated by the arrow $A_1$. In FIG. 8, sizes of the gap 66 before thermal expansion are denoted by dimensions $L_5$ and $L_6$, and in FIG. 9, a size of the gap 66 before thermal expansion is denoted by a dimension $L_7$. Meanwhile, in FIG. 10, sizes of the gap 66 after thermal expansion are denoted by dimensions $L_8$ and $L_9$, and in FIG. 11, a size of the gap 66 after thermal expansion is denoted by a dimension $L_{10}$. The dimensions $L_5$, $L_6$ and $L_7$ correspond to the dimensions $L_8$, $L_9$ and $L_{10}$, respectively. The dimensions $L_5$ and $L_8$ indicate gaps of the first supporting member 44.

Referring to FIGS. 1 to 11, assume that a temperature of the processing chamber 12 has increased. If the temperature of the processing chamber 12 increases, the cylindrical sidewall 23 including the jacket and the outer gas supply member 40 may thermally expand outwardly in a diametric direction. In such a case, since the sidewall 23 is made of aluminum and the outer gas supply member 40 is made of quartz, degrees of their thermal expansion may be different. To be specific, since a thermal expansion coefficient of aluminum is larger than a thermal expansion coefficient of quartz by about one digit, the degree of the diameter expansion of the cylindrical sidewall 23 may be larger than the degree of the diameter expansion of the outer gas supply member 40.

Here, since the outer gas supply member 40 is fixed to the first mount 47 by the first supporting member 44, the outer gas supply member 40 may be slightly moved in the direction of the arrow $A_1$ of FIG. 4. That is, the outer gas supply member 40 may be shifted by an expansion amount of the sidewall 23 that expands in a diametric direction. Meanwhile, since the circular ring-shaped outer gas supply member 40 also thermally expands in a diametric direction, the gas supply member 40 in the second supporting member 45 tends to be expanded in a diametric direction, i.e., in an outward direction indicated by the arrow $A_2$ of FIG. 6 and also tends to move in the direction indicated by the arrow $A_1$, i.e., toward the side where the first supporting member 44 is located. In such a case, since the gap 66 exists, the arc-shaped member 55 of the second supporting member 45 merely moves as illustrated in FIGS. 10 and 11, and the recess 62 formed in the second mount 48 and the arc-shaped member 55 do not interfere with each other. Here, the dimension $L_8$ becomes larger than the dimension $L_5$, whereas the dimension $L_9$ becomes smaller than the dimension $L_6$. Meanwhile, in the diametric direction, the dimension $L_{10}$ becomes smaller than the dimension $L_7$. That is, since a gap 67 exists between the arc-shaped member 55 and the recess 62, even in case of thermal expansion, the stress caused by deformation due to the temperature variation may not be generated. The second supporting member 46 has the same effect as the second supporting member 45.

Moreover, the same description may be available for the case when the temperature of the processing chamber 12 decreases. That is, since the degrees of thermal contraction between the sidewall 23 and the outer gas supply member 40 are different, the arc-shaped member 55 may be moved with respect to the second supporting members 45 and 46 in the opposite direction to that described in the above case of thermal expansion. However, since the gap 67 exists between the arc-shaped member 55 and the recess 62 even in case of thermal contraction, a stress caused by a deformation due to a temperature variation may not be generated.

As discussed above, in accordance with the plasma processing apparatus and the gas supply member supporting device of the present disclosure, since the second supporting member is movably supported in the mount, a movement of the gas supply member can be allowed even when a stress is applied to the gas supply member during the plasma process or during installation of the gas supply member. Accordingly, concentration of a stress on the second supporting member can be avoided. In this embodiment, since the first supporting member is fixed to the mount, the gas supply member can be stably supported at a certain position within the processing chamber. Thus, the plasma process can be performed while supplying the gas securely.

Furthermore, in this embodiment, between the mount and the second supporting member, there is provided the gap that allows the movement of the gas supply member according to the deformation of the gas supply member due to the temperature variation. Accordingly, by using the gap, the second supporting member can be allowed to move according to the deformation of the gas supply member due to the temperature variation.

Further, in the present embodiment, the first supporting member has the hollow area therein, and the gas can be supplied to the gas supply member from the outside of the processing chamber through the hollow area of the first supporting member. Accordingly, it may be possible to securely supply the gas to the gas supply member through the hollow area of the fixed first supporting member.

Moreover, in this embodiment, an elastic member for allowing a displacement of the second supporting member may be provided between the second supporting member and the mount.

In addition, the size of the gap between the second supporting member and the second mount may be determined depending on the materials of the sidewall 23 and the outer gas supply member, the diameter of the outer gas supply member, an estimated range of the processing temperature in the plasma processing chamber, or the like. In the plasma processing apparatus as configured above, since the durability of the supporting member for supporting the outer gas supply member is obtained even when there is a great temperature variation, the supporting member can be stably used even if the processing temperature is set to be, e.g., about 100° C. or higher by installing a heater within the sidewall, for example.

Further, an O-ring may be used as an elastic member for elastically supporting the second supporting member between the second supporting member and the second mount. Referring back to FIG. 8, an O-ring 82 is provided between the second supporting member 45 and the second mount 48, specifically, between the arc-shaped member 55 and a pressing member 81 provided above the arc-shaped member 55 and constituting the second mount 48. The O-ring 82 is provided between an upper end surface 83 of the arc-shaped member 55 and a lower end surface 84 of the pressing member 81. The O-ring 82 is configured so as not to escape from the upper end surface of the arc-shaped member 55. The O-ring 82 is disposed between the upper end surface 83 and the lower end surface 84 such that it is elastically deformable in a vertical direction. As for the elastic deformation, the O-ring 82 is configured to come into contact with the second supporting member 45 and the second mount 48 due to elastic deformation in any of cases where a height difference between the upper end surface 83 of the arc-shaped member 55 and the lower end surface 84 of the pressing member 81 is maximum or minimum. By using this configuration, the movable arc-shaped member 55 can be securely supported by the second supporting member 45. Furthermore, the O-ring 82 for supporting the second supporting member 45 may have lower sealing property than the O-ring for supporting the first supporting member 44, but the O-ring 82 may have higher cushion property and sliding property than the O-ring for supporting the first supporting member 44. By using such an O-ring, a holding power for the supporting member movably supported in the mount can be improved.

Moreover, in the above-described embodiment, although the fixed first supporting member has the hollow area therein to be used as a gas supply passage, the present disclosure may not be limited thereto, but the movable second supporting member may have a hollow area therein to be used as a gas supply passage.

Further, in the above-described embodiment, although one first supporting member and two second supporting members are provided, the present disclosure may not be limited thereto. By way of example, more than three second supporting members may be provided. Furthermore, the supporting members may not be substantially equi-spaced.

Besides, in the above-described embodiment, although the processing chamber is described to have the cylindrical sidewall, the present disclosure may not be limited thereto. The sidewall may have a box shape. By way of example, when viewed from a vertical direction, an inner wall surface of the processing chamber may have a rectangular shape. Further, the outer gas supply member may not have the circular ring-shape, but the outer gas supply member may have an arc shape that is formed by cutting a part of the circular ring-shaped member.

In addition, in the above-described embodiment, although the jacket of the supporting device and the sidewall of the processing chamber are described to be separable, the present disclosure may not be limited thereto. For example, the jacket and the sidewall may be formed as one body, and the supporting device may be formed by a part of the sidewall.

Furthermore, in the aforementioned embodiment, a gap for allowing a movement of the gas supply member is provided between the mount and the second supporting member. However, this gap may not be a void, but a flexible member may be filled in the gap. In this way, sealing property can be more improved.

Moreover, in the above-described embodiment, although the outer gas supply member is made of quartz, the present disclosure may not be limited thereto. The outer gas supply member may be made of any dielectric material such as alumina or aluminum nitride. Further, even if the outer gas supply member is made of a metal, the above-described effect may be expected as long as a thermal expansion coefficient or a temperature of the outer gas supply member is different from a thermal expansion coefficient or a temperature of the sidewall. Further, although the sidewall is described to be made of aluminum, the sidewall may be made of other metal.

Besides, in the above-described embodiment, the thermal expansion coefficient of the gas supply member and the thermal expansion coefficient of the sidewall member are different. However, the present disclosure may also be applicable to a case that the thermal expansion coefficients of the gas supply member and the sidewall member are substantially equivalent. Assume that the thermal expansion coefficient of the gas supply member and the thermal expansion coefficient of the sidewall are substantially equivalent, and the gas supply member is installed during the assembly of the plasma processing apparatus, and a strong stress is applied to the supporting member. In such a case, a movement of the gas supply member is allowed because the second supporting member is movably supported in the mount. Accordingly, concentration of the stress on the second supporting member can be avoided.

Further, although the above embodiment has been described for the case of using the RLSA microwave plasma processing apparatus, the present disclosure may not be limited thereto, but may also be applicable to various microwave plasma processing apparatuses using a microwave as a plasma source. Besides the microwave plasma processing apparatus, the present disclosure may also be applicable to various plasma processing apparatuses using parallel plate type plasma, ICP (Inductively-Coupled Plasma), ECR (Electron Cyclotron Resonance) plasma or the like as a plasma source.

While various aspects and embodiments have been described herein, other aspects and embodiments will be apparent to those skilled in the art. The various aspects and embodiments disclosed herein are for the purposes of illustration and are not intended to be limiting. Therefore, the true scope and spirit of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A plasma processing apparatus for performing a plasma process on a processing target substrate, the apparatus comprising:

a processing chamber including a bottom and a cylinder-shaped sidewall upwardly extending from a periphery of the bottom and configured to accommodate therein the processing target substrate;

a gas supply member provided at a preset position within the processing chamber and provided with a gas supply opening for supplying a plasma processing gas;

a plurality of supporting members arranged so as to connect the gas supply member with the sidewall; and a mount formed by a recess in a part of the sidewall and configured to connect each supporting member to the sidewall, wherein the plurality of supporting members include a first supporting member fixed to the mount and a second supporting member movably supported at the mount, a thermal expansion coefficient of the gas supply member is different from a thermal expansion coefficient of the sidewall, the second supporting member includes a rod-shaped member extending straight in a radial direction, and an arc-shaped member installed at an outer end of the rod-shaped member, the mount includes a recess formed in a curved shape to accommodate therein the arc-shaped member, the arc-shaped member is dimensioned about the recess such that a gap exists between an inner surface of the recess and an outer surface of the arc-shaped member and such that the arc-shaped member is movable in substantially all directions within the recess, the first supporting member has a hollow area therein, and a gas is supplied into the gas supply member from the outside of the processing chamber through the hollow area of the first supporting member.

2. The plasma processing apparatus of claim 1, wherein an elastic member allowing displacement of the second supporting member is provided between the second supporting member and the mount.

3. The plasma processing apparatus of claim 1, wherein the gas supply member is made of a dielectric material, and the sidewall is made of a metal.

4. The plasma processing apparatus of claim 1, wherein the mount is configured as a part of the sidewall, and the sidewall is separable in a vertical direction by the mount as a boundary.

5. The plasma processing apparatus of claim 1, wherein the gas supply member extends in a circular ring shape, and the plurality of supporting members are arranged at a substantially same interval in a circumferential direction of the circular ring-shaped gas supply member.

6. The plasma processing apparatus of claim 1, further comprising:

an injector having a gas supply opening that supplies a gas toward a center of the processing target substrate.

7. The plasma processing apparatus of claim 1, further comprising:

a microwave generator generating a microwave, a dielectric window transmitting the microwave generated by the microwave generator into the processing chamber, and a slot antenna plate having a plurality of slot holes and propagating the microwave generated by the microwave generator to the dielectric window.

* * * * *

UNITED STATES PATENT AND TRADEMARK OFFICE
CERTIFICATE OF CORRECTION

PATENT NO. : 8,663,424 B2  
APPLICATION NO. : 13/115289  
DATED : March 4, 2014  
INVENTOR(S) : Naoki Mihara Page 1 of 1

It is certified that error appears in the above-identified patent and that said Letters Patent is hereby corrected as shown below:

In the specification, column 4, line 16, please add - 17 - between "waveguide" and "in"

Signed and Sealed this
Eighth Day of July, 2014

Michelle K. Lee
*Deputy Director of the United States Patent and Trademark Office*